(12) United States Patent
Jambunathan et al.

(10) Patent No.: US 11,004,954 B2
(45) Date of Patent: May 11, 2021

(54) EPITAXIAL BUFFER TO REDUCE SUB-CHANNEL LEAKAGE IN MOS TRANSISTORS

(71) Applicant: INTEL CORPORATION, Santa Clara, CA (US)

(72) Inventors: Karthik Jambunathan, Hillsboro, OR (US); Glenn A. Glass, Portland, OR (US); Anand S. Murthy, Portland, OR (US); Jack T. Kavalieros, Portland, OR (US); Seung Hoon Sung, Portland, OR (US); Benjamin Chu-Kung, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/326,844

(22) PCT Filed: Sep. 30, 2016

(86) PCT No.: PCT/US2016/054644
§ 371 (c)(1),
(2) Date: Feb. 20, 2019

(87) PCT Pub. No.: WO2018/063280
PCT Pub. Date: Apr. 5, 2018

(65) Prior Publication Data
US 2019/0214479 A1    Jul. 11, 2019

(51) Int. Cl.
*H01L 29/66* (2006.01)
*H01L 29/417* (2006.01)
(Continued)

(52) U.S. Cl.
CPC .......... *H01L 29/66545* (2013.01); *H01L 21/823807* (2013.01); *H01L 21/823814* (2013.01);
(Continued)

(58) Field of Classification Search
CPC .......... H01L 29/66803; H01L 29/1025; H01L 29/66; H01L 29/66545; H01L 29/66795; H01L 29/7851
See application file for complete search history.

(56) References Cited

U.S. PATENT DOCUMENTS 7,781,771 B2 * 8/2010 Lindert ............ H01L 29/78687
257/66
8,748,940 B1   6/2014 Rachmady et al.
(Continued)

FOREIGN PATENT DOCUMENTS

WO    2018063280 A1    4/2018

OTHER PUBLICATIONS

International Search Report and Written Opinion received for PCT/US2016/054644, dated Jun. 28, 2017. 14 pages.
(Continued)

*Primary Examiner* — Seahvosh Nikmanesh
(74) *Attorney, Agent, or Firm* — Schwabe, Williamson & Wyatt, P.C.

(57) ABSTRACT

Integrated circuit transistor structures are disclosed that include a single crystal buffer structure that is lattice matched to the underlying single crystal silicon substrate. The buffer structure may be used to reduce sub-fin leakage in non-planar transistors, but can also be used in planar configurations. In some embodiments, the buffer structure is a single continuous layer of high bandgap dielectric material that is lattice matched to silicon. The techniques below can be utilized on NMOS and PMOS transistors, including any number of group IV and III-V semiconductor channel materials.

19 Claims, 8 Drawing Sheets

(51) Int. Cl.
  *H01L 29/78* (2006.01)
  *H01L 21/8238* (2006.01)
  *H01L 27/092* (2006.01)
  *H01L 29/786* (2006.01)
  *H01L 29/775* (2006.01)
  *H01L 29/06* (2006.01)
  *B82Y 10/00* (2011.01)

(52) U.S. Cl.
  CPC .. *H01L 21/823821* (2013.01); *H01L 27/0924* (2013.01); *H01L 29/417* (2013.01); *H01L 29/41733* (2013.01); *H01L 29/41791* (2013.01); *H01L 29/785* (2013.01); *H01L 29/78618* (2013.01); *H01L 29/78696* (2013.01); *B82Y 10/00* (2013.01); *H01L 29/0673* (2013.01); *H01L 29/66439* (2013.01); *H01L 29/775* (2013.01)

(56) References Cited

U.S. PATENT DOCUMENTS

| | | | |
|---|---|---|---|
| 9,263,464 B2* | 2/2016 | Basu | H01L 21/84 |
| 2002/0030246 A1 | 3/2002 | Eisenbeiser | |
| 2003/0013280 A1* | 1/2003 | Yamanaka | H01L 21/02535 438/487 |
| 2003/0148565 A1* | 8/2003 | Yamanaka | H01L 21/02532 438/200 |
| 2008/0142841 A1* | 6/2008 | Lindert | H01L 29/1054 257/190 |
| 2013/0040431 A1 | 2/2013 | Ye et al. | |
| 2013/0264639 A1 | 10/2013 | Glass et al. | |
| 2013/0333751 A1 | 12/2013 | Norman | |
| 2014/0027860 A1 | 1/2014 | Glass et al. | |
| 2014/0094223 A1 | 4/2014 | Dasgupta et al. | |
| 2016/0204208 A1 | 7/2016 | Goel et al. | |
| 2016/0204209 A1 | 7/2016 | Chou et al. | |
| 2016/0260802 A1 | 9/2016 | Glass et al. | |

OTHER PUBLICATIONS

International Preliminary Report on Patentability received for PCT/US2016/054644, dated Apr. 2, 2019. 10 pages.

"Leakage Current Reduction Techniques in Poly-Si TFTs for Active Matrix Liquid Crystal Displays: A Comprehensive Study," IEEE Trans. on Device and Materials Reliability, vol. 6, Jun. 2006. 57 pages.

Office Action from Taiwan Patent Application No. 106127483, dated Nov. 25, 2020, 10 pages.

* cited by examiner

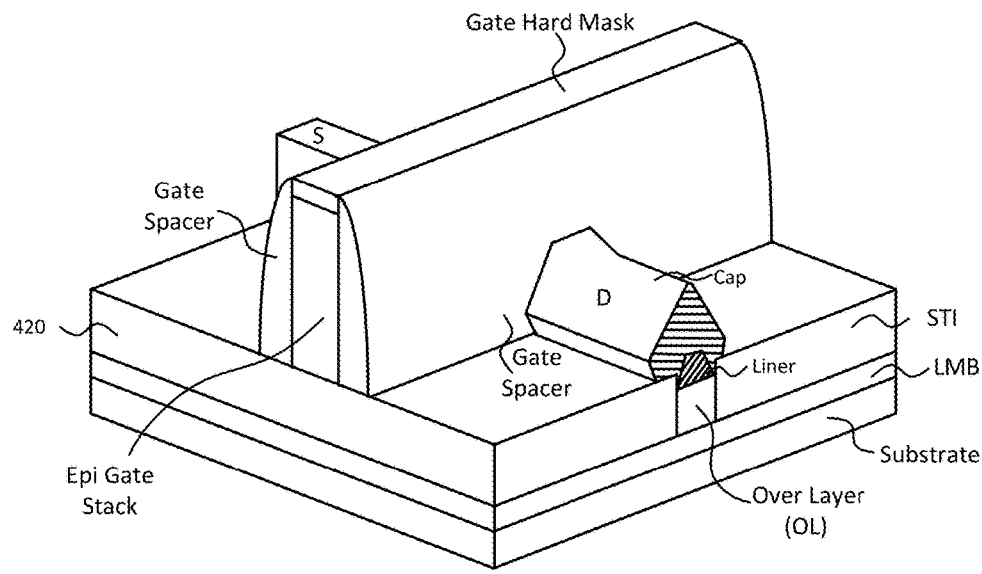
Fig. 4a
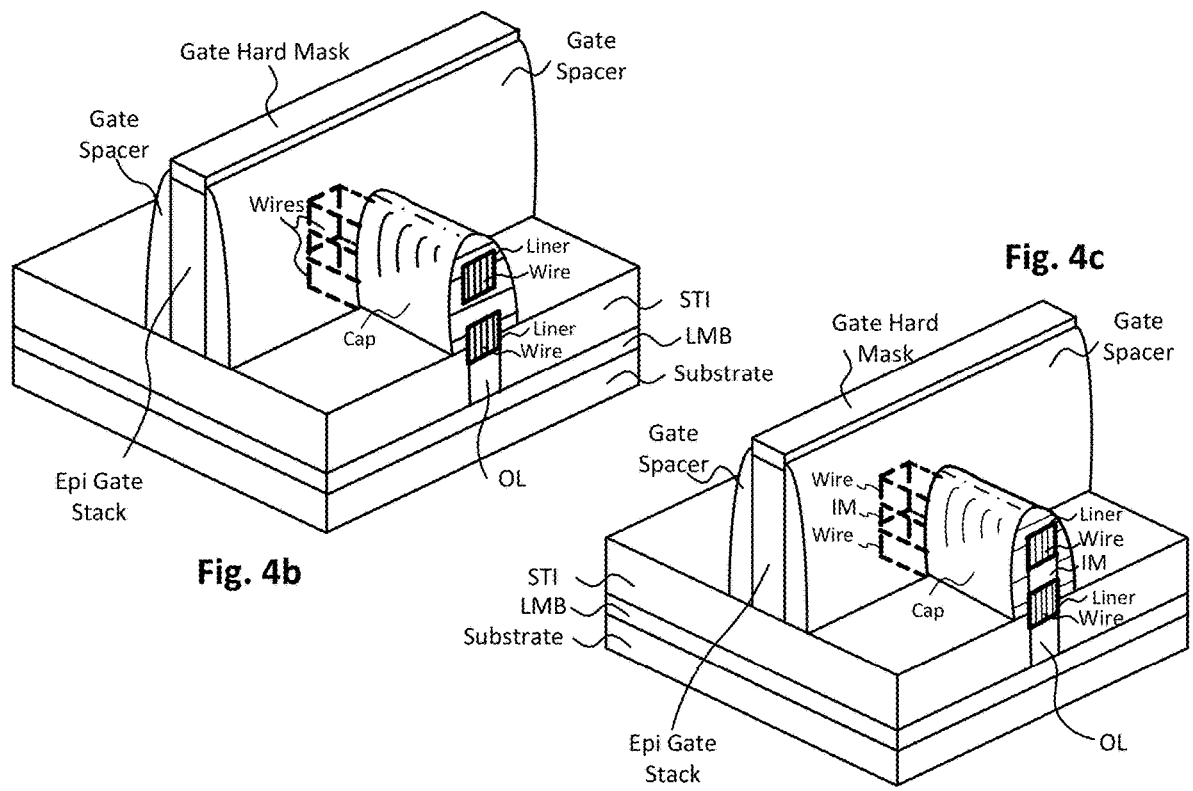
Fig. 4b
Fig. 4c

EPITAXIAL BUFFER TO REDUCE SUB-CHANNEL LEAKAGE IN MOS TRANSISTORS

CROSS-REFERENCE TO RELATED APPLICATIONS

This patent application is a U.S. National Phase Application under 35 U.S.C. § 371 of International Application No. PCT/US2016/054644, filed on Sep. 30, 2016, the entire contents of which is hereby incorporated by reference herein.

BACKGROUND

Semiconductor devices are electronic components that exploit the electronic properties of semiconductor materials, such as silicon (Si), germanium (Ge), and gallium arsenide (GaAs), to name a few common examples of semiconductor materials. A field-effect transistor (FET) is a semiconductor device that generally includes a gate, a source, and a drain. Metal-oxide-semiconductor FETs or so-called MOSFETs are commonly used for amplifying or switching electronic signals. In operations, a FET uses an electric field applied to the gate to control the electrical conductivity of a channel through which charge carriers (e.g., electrons or holes) flow from the source to the drain. A gate dielectric is used to separate the gate from other regions of the FET, including the source and drain as well as the channel that connects source and drain when the transistor is biased to an on or otherwise conductive state (as opposed to an off-state or non-conductive state). The source and drain regions can be either p-type or n-type doped to provide PMOS FETs or NMOS FETs, respectively. In some cases, MOSFETs include side-wall or so-called gate spacers on either side of the gate that can help determine the channel length and can help with replacement gate processes. Complementary MOS (CMOS) integrated circuit structures use a combination of PMOS and NMOS FETs to implement logic gates and other digital circuits. FETs can be implemented in both planar and non-planar architectures. For instance, a finFET is a non-planar transistor built around a thin strip of semiconductor material (generally referred to as a fin). A finFET includes the standard FET nodes, including a gate, a gate dielectric, a source, and a drain. The conductive channel of the device resides on the outer portions of the fin adjacent to the gate dielectric. Specifically, current runs along/within both side-walls of the fin (sides perpendicular to the substrate surface) as well as along the top of the fin (side parallel to the substrate surface). Because the conductive channel of such configurations essentially resides along the three different outer, planar regions of the fin, such a finFET design is sometimes referred to as a tri-gate transistor. Another type of finFET is the so-called double-gate finFET configuration, in which the conductive channel principally resides only along the two sidewalls of the fin (and not along the top of the fin). Another non-planar transistor configuration is sometimes referred to as a nanowire configuration, which is configured similarly to a fin-based transistor, but instead of a finned channel region, one or more nanowires (or nanoribbons, depending on aspect ratio) are used and the gate material generally surrounds each nanowire. Such nanowire configurations are sometimes called gate-all-around FETs. For any such configurations, there are a number of performance issues that can arise.

BRIEF DESCRIPTION OF THE DRAWINGS

FIGS. 4a through 4c each illustrates a perspective view of an integrated circuit structure formed during the method of FIG. 1, and that is configured in accordance with other embodiments of the present disclosure.

Figure 1:
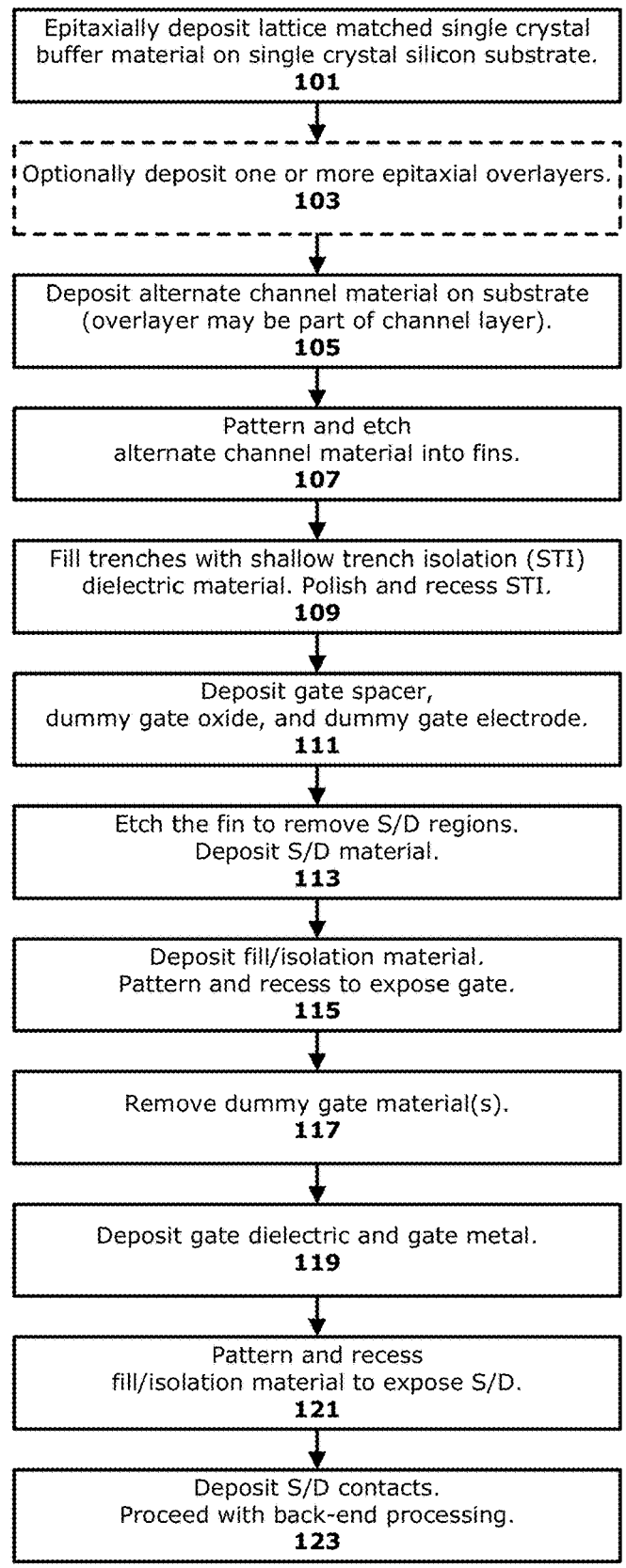
FIG. 1 illustrates a method for forming an integrated circuit including one or more MOS transistors configured with a single crystal buffer that is lattice matched to a single crystal silicon substrate, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations and structures shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Moreover, the resulting structures depicted don't necessarily show each and every feature of a functional integrated circuit; rather, the structures are drawn to depict certain features to help facilitate understanding of the disclosure. Various other not shown features of each integrated circuit structure, whether those features end up in the final structure or are sacrificial or otherwise intermediate in nature, will be apparent in light of this disclosure. In short, the figures are provided to facilitate understanding of the techniques provided the present disclosure, and numerous structures may result from carrying out such techniques.

DETAILED DESCRIPTION

Integrated circuit transistor structures are disclosed that include an epitaxial buffer structure to reduce sub-channel leakage. The buffer layer is below the channel and is lattice matched to a single crystal silicon substrate. In some embodiments, the lattice matched buffer structure is a single continuous layer of single crystal dielectric material (e.g., oxide or nitride) that has a high bandgap relative to single crystal silicon. The reduction in sub-channel leakage is due to the large bandgap of the single crystal dielectric material, relative to silicon. As will be appreciated, the techniques can be utilized on NMOS and PMOS transistors, including transistors having any number of single crystal group IV and III-V semiconductor channel materials. Note that the single crystal channel material need not be lattice matched to silicon as well, although it may be in some embodiments. In addition, the techniques can be used on both planar and non-planar architectures (e.g., finFETs and nanowire transistor configurations) that are prone to sub-channel or sub-fin leakage. Numerous embodiments and configurations will be apparent.

General Overview

As previously noted, there are a number of performance issues that can arise with MOS transistors. One such problem is sub-channel leakage, also referred to as sub-fin leakage in non-planar devices. Such leakage generally refers to loss of charge carriers (e.g., electrons or holes) flowing from the source to the drain via the area below the planar channel region (in planar architecture devices) or the sub-fin below the non-planar channel region (in non-planar architecture devices). Although all transistors are susceptible to sub-channel leakage, non-planar transistor architectures such as finFETs and nanowire transistors configured with alternate channel materials (SiGe, germanium, or other channel material that is compositionally different from the underlying silicon substrate) can be particularly susceptible to high sub-fin leakage due to factors such as reduced gate length, lower bandgap associated with such alternate channel materials, and high source/drain doping. Current techniques for controlling sub-channel leakage include sub-fin or sub-channel doping (of the channel region) or use of a silicon-on-insulator (SOI) substrate configuration. However, these conventional techniques tend to provide insufficient isolation for alternate channel materials (due to the doping requirements and low bandgap of typical alternate channel materials) and are relatively expensive to implement.

Thus, the present disclosure provides MOS transistors that include an epitaxial buffer structure which is lattice matched to an underlying single crystal silicon substrate. The buffer can be used, for example, to reduce sub-channel leakage and improve drive current in NMOS and PMOS transistor devices, in both non-planar and planar configurations. In an example embodiment, the lattice matched buffer structure includes a single continuous layer of high bandgap single crystal dielectric material (e.g., oxide or nitride) that is lattice matched to single crystal silicon of a given substrate (such as a bulk single crystal silicon substrate, or a single crystal silicon-on-insulator substrate configuration). The techniques can be utilized with any number of group IV and III-V semiconductor channel materials, as well as any number of source/drain configurations.

In some embodiments, the single crystal material used in the buffer structure can be selected based on its ability to lattice match with the single crystal silicon of the underlying silicon substrate. An epitaxial deposition process is used to provide the single crystal buffer material on the underlying single crystal silicon substrate. In accordance with an embodiment, if single crystal material 1 and single crystal material 2 are said to be lattice matched to one another, this means that the lattice parameters of material 1 and material 2 are equal within +/−2%. In a more general sense, material 1 and material 2 are said to be lattice matched to one another if the lattice parameters of those materials 1 and 2 are the same or otherwise within an acceptable tolerance so as to allow for lattice continuity across the interface between the different single crystal materials 1 and 2 (including the interface between the buffer structure and the substrate, according to an embodiment of the present disclosure).

As used herein, the term "lattice parameter" refers to the distance between rows of atoms or spacing between rows of atoms in a given crystallographic direction of a single crystal material. The single crystal material may be elemental or a compound or alloy. The distance or spacing between rows of atoms can vary as a function of the alloy concentrations or phase of a given single crystal compound. So, the types and quantity of each of the atoms used in a given single crystal material will dictate the lattice parameter and crystal structure. As will be appreciated in light of this disclosure, there are a number of single crystal dielectric buffer materials where the lattice parameters of those materials are sufficiently matched (e.g., within 2%) to silicon and the crystal type is cubic, such that those materials will grow on a single crystal silicon substrate and make a lattice matched interface with favorable electronic properties, including reduced sub-channel (or sub-fin, as the case may be) leakage. For elemental single crystal materials, the lattice parameter can be measured, for example, to be the average distance between adjacent planes of atoms (as measured from center of nuclei) of the single crystal material in a given crystallographic direction. For compound and alloy single crystal materials, the lattice parameter can similarly be measured as the average distance between adjacent planes of atoms of the compound or alloy single crystal material.

In accordance with some embodiments, the lattice matched buffer structure includes a single crystal dielectric material from group IV or III-V of the periodic table of elements. Example single crystal dielectric materials that can be used in the lattice matched buffer structure include, for instance, an oxide or nitride material including strontium, titanium, lanthanum, aluminum, neodymium, lutetium, or gadolinium, or a combination thereof such as strontium titanate ($SrTiO_3$), lanthanum aluminate ($LaAlO_3$), lanthanum lutetium oxide ($LaLuO_3$); gadolinium scandium oxide ($GdScO_3$), neodymium aluminate ($NdAlO_3$), gadolinium aluminate ($GdAlO_3$), to name a few. Such dielectric materials are lattice matched to silicon, have a high thermal stability, and sufficiently large valence and conduction band offsets relative to silicon and hence can reduce sub-channel or sub-fin leakage effectively, as will be appreciated. The thickness of the single crystal dielectric layer can vary from one embodiment to the next, but in some example cases is in the range of a single monolayer to 20 nanometers.

The other layers in the transistor structure do not necessarily have to be single crystal but can be in some embodiments. The channel material is typically single crystal. Example single crystal channel semiconductor materials include, for instance, silicon, germanium, tin, indium, gallium, arsenic, and aluminum, to name a few. Recall that the channel need not be lattice matched to the buffer. The source/drain regions, gate dielectric, and gate electrode are typically not single crystal (rather, they are polycrystalline or amorphous). Nor do the source/drain regions, gate dielectric, and gate electrode need to be lattice matched, although in some embodiments they are. Numerous materials systems will be appreciated in light of this disclosure.

Use of the techniques and structures provided herein may be detectable, for example, using elemental mapping via secondary ion mass spectrometry, transmission electron microscopy (TEM), or atom probe tomography to look at composition profiles across the source/drain or channel regions to confirm lattice matching and single crystal epitaxy across the substrate-buffer interface. To this end, lattice continuity at the substrate buffer interface is a structural feature that can be seen in a high resolution TEM image. In addition, such tools may be used to identify the presence of specific elements at the interface via electron energy loss spectroscopy, EDX line scans, or Z-contrast. Thus, for example, a SEM image of the gate structure can be used to show lattice continuity through the channel-dielectric interface, or through both the channel-dielectric interface and the dielectric-electrode interface. Numerous configurations will be apparent in light of this disclosure.

Methodology and Architecture

FIG. 1 illustrates a method for forming an integrated circuit including one or more MOS transistors configured with a single crystal buffer that is lattice matched to a single crystal silicon substrate, in accordance with an embodiment of the present disclosure. As will be appreciated in light of this disclosure, using an epitaxial (single crystal) lattice matched layer of the high bandgap material as a buffer in the sub-channel regions of a transistor design allows for lattice continuity through the substrate-buffer interface and can have the effect of reducing sub-channel leakage. In contrast to present disclosure, transistor designs that might employ amorphous or polycrystalline buffer materials would not have such lattice continuity or comparable leakage suppression. FIGS. 2a through 2j illustrate example structures that are formed when carrying out the method of FIG. 1, in accordance with some such embodiments. While a non-planar transistor architecture is shown (fin-based transistors), the techniques provided herein can also be used with planar architecture. To this end, the side views of FIGS. 2a-j also represent example planar transistor embodiments. In any case, one or more such MOS transistors may be formed in the fabrication of, for example, a processor or a communication chip or a memory chip or any other integrated circuit having MOS transistors. Such integrated circuits can then be used in various electronic devices and systems, such as desktop and laptop computers, smart phones, tablet computers, and test equipment, to name a few examples. Numerous applications and functional circuits will be apparent.

Figure 2A:
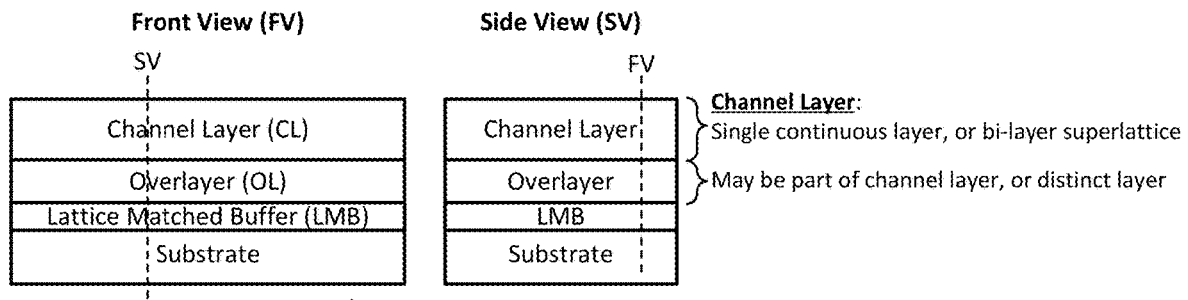
FIGS. 2a through 2j each illustrates front and side cross-sectional views of an integrated circuit structure formed during the method of FIG. 1, and that is configured in accordance with an embodiment of the present disclosure.

As can be seen, the example method includes epitaxially depositing 101 single crystal buffer material on a single crystal silicon substrate. The buffer material is compositionally different from the underlying single crystal silicon, but is lattice matched to that single crystal silicon. The lattice matched buffer material can be, for example, a single continuous layer of dielectric material such as a high bandgap oxide or nitride, as will be discussed in turn. FIG. 2a shows an example resulting structure after the epitaxial deposition process to provision the lattice matched buffer (LMB), with the front view (FV) cross-section being on the left and the side view (SV) cross-section being on the right. With respect to FIGS. 2a-j, the front view cross-sections are taken perpendicular to the fins and through the drain region, and the side view cross-sections are taken through and parallel to a fin. The fins are not formed until FIG. 2b, and the source/drain regions are not formed until FIG. 2e, in this example process flow.

Any number of suitable single crystal silicon substrate configurations can be used, including bulk single crystal silicon substrates, or silicon-on-insulator substrates (SOI) having a top layer of single crystal silicon, or any other multi-layered structures having a top layer of single crystal silicon. In some example cases, the buffer may be pre-integrated with the substrate. In any such cases, the single crystal buffer is lattice matched to the single crystal silicon, and there is lattice continuity across the entire substrate-buffer interface, as will be appreciated.

As previously explained, and in accordance with some embodiments, the buffer material includes a single continuous layer of single crystal dielectric material from group IV or III-V of the periodic table of elements. Example single crystal dielectric materials that can be used in the buffer structure include, for instance, an oxide or nitride material including strontium, titanium, lanthanum, aluminum, neodymium, lutetium, or gadolinium, or a combination thereof, to name a few. In some specific embodiments, the single crystal dielectric material of the buffer structure is or otherwise comprises one of strontium titanate ($SrTiO_3$), lanthanum oxide ($La_2O_3$), lanthanum aluminate ($LaAlO_3$), lanthanum lutetium oxide ($LaLuO_3$); yttrium lanthanum oxide ($LaY)_2O_3$, gadolinium scandium oxide ($GdScO_3$), neodymium aluminate ($NdAlO_3$), or gadolinium aluminate ($GdAlO_3$). Such dielectric materials are lattice matched to silicon, have a high thermal stability, and sufficiently large valence and conduction band offsets relative to silicon and hence can reduce sub-channel or sub-fin leakage effectively, as will be appreciated. The thickness of the single crystal dielectric layer can vary from one embodiment to the next, but in some example cases is in the range of a single monolayer to 20 nanometers.

With further reference to FIG. 1, the method may optionally include depositing 103 one or more semiconductor overlayers, followed by depositing 105 an alternate semiconductor channel material. In some embodiments where the optional deposition at 103 is included, the one or more overlayers are distinct from the channel material, and can be for example, a layer of silicon, silicon germanium, gallium arsenide, indium gallium arsenide, or some other suitable semiconductor material upon which the channel material can sit. In other embodiments, the overlayer is simply the lower, undoped part of the channel layer, as will be appreciated. Thus, the channel layer may either sit directly on the buffer, or may be offset from the buffer by one or more intervening overlayers. The vertical thickness of the overlayer can vary from one embodiment to the next, but is in the range of 10 nm to 300 nm. In a more general sense, vertical thickness of the overlayer can be set depending on factors such as the desired distance between the active channel and the underlying buffer and the thickness of the STI, and the height of the active channel portion of the fin (for non-planar configurations). The example structure of FIG. 2a further shows the overlayer and channel layer as being distinct from one another, but other embodiments where the channel layer includes the overlayer and sits directly on the buffer will also be apparent in light of this disclosure.

The channel material in this example embodiment is said to be alternate, because it is compositionally different from the underlying silicon. In other embodiments, however, note that the channel layer need not be an alternate material (it can be single crystal silicon, doped or undoped). In accordance with some embodiments, the alternate channel material includes a single crystal semiconductor material from group IV or III-V. In some such cases, the alternate channel material includes at least one of silicon, germanium, tin, indium, gallium, arsenic, or aluminum. Specific example group IV single crystal channel semiconductor materials include, for instance, germanium, tin, silicon germanium (SiGe), germanium:tin (GeSn), to name a few. Example group III-V single crystal channel semiconductor materials include, for instance, indium, gallium, arsenic, aluminum, gallium arsenide (GaAs), indium gallium arsenide (InGaAs), to name a few. In a more general sense, the channel material can be any channel material suitable for a target transistor application prone to sub-channel leakage.

As previously noted, each of the overlayer and channel layer may be discrete, single continuous layers of differing materials (e.g., silicon overlay and SiGe channel layer), or may be a single continuous layer that includes both the overlayer and channel layer (e.g., silicon or SiGe channel layer). In any cases, one or more components of a given single continuous layer may be graded, whether in the overlayer, the channel layer, or both. For instance, in one example case having a distinct overlayer, the overlayer layer is a single continuous layer of SiGe having a germanium concentration that is graded from about 10% or less at the buffer interface up to about 90% or higher at its top surface, and the channel layer is pure germanium (doped or undoped). In another example case, the channel layer includes the overlayer and is a single continuous layer of silicon or SiGe or GaAs having a dopant concentration that is stepped from no doping for the overlayer portion of the channel layer to a target dopant concentration for the channel portion of the channel layer. In still other embodiments, the channel material can be provided in the context of multilayer stacks that include, for example, one or more layers of different channel materials, or alternating layers of desired channel material and sacrificial/inactive material. Such multilayer configurations may be useful, for instance, for transistor structures that will include one or more nanowires in the channel and/or source/drain regions, as will be appreciated. In any such configurations, the thickness of the layer(s) and any dopant concentrations can be adjusted as needed.

Figure 2B:
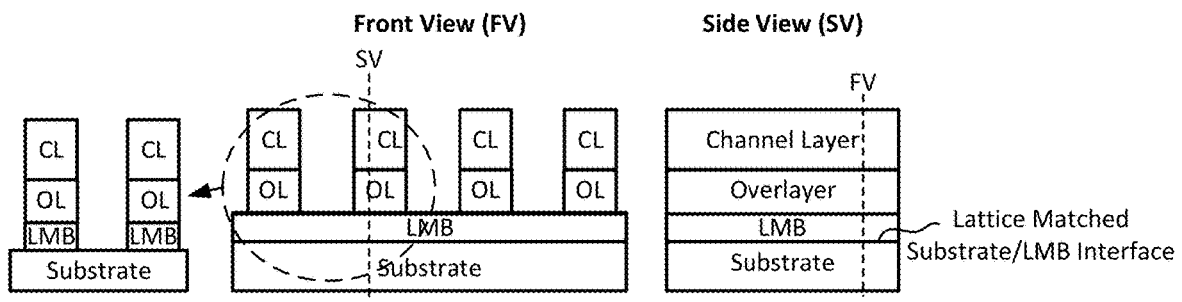

With further reference to the example embodiment of FIG. 1, the method continues with patterning and etching 107 the alternate channel material and overlayer to form a plurality of fins. The resulting structure is shown in FIG. 2b. In this example case, the fin includes both the channel layer and a portion of the overlayer, such that the fins appear to be sitting on the lattice matched buffer. In other embodiments, the fin etch process may stop at the interface between the overlayer and channel layer or within the overlayer or within the buffer. In still other embodiments, the fins can be formed using an aspect ratio trapping (ART) methodology, such as that described in U.S. Patent Application Publication 2014/0027860. In such cases, the channel material and possibly the overlayer material can be provided after so-called placeholder fins are formed and then recessed. In more detail, a structure including the silicon substrate and lattice matched buffer can be covered with a dummy channel material. The dummy channel material layer is then patterned and etched into placeholder or dummy fins. Those dummy fins are then encased in an insulator or other suitable material. The dummy fins can then selectively be recessed or otherwise removed and replaced with a desired channel layer and overlayer layer (if distinct from channel layer). In some such embodiments, note that the lower portion of the dummy fins can provide the overlayer. The resulting structure would again look like that shown in FIG. 2b, according to some such embodiments. In still other such ART-based embodiments, even the lattice matched buffer can be selectively provided in the trench left after dummy fin removal, rather than blanket deposited. For example, in some such embodiments, a single crystal silicon substrate is patterned and etched into dummy silicon fins, which are then encased in an insulator or other suitable material. The dummy fins are then selectively recessed or otherwise removed and replaced with the lattice matched buffer material and the desired channel layer and overlayer layer (if distinct from channel layer). FIG. 2b' shows an example resulting structure according to some such embodiments. Note how the LMB layer in such embodiments is limited to being under the fins and is not between the fins as is the case with blanket deposition as shown in FIG. 2b. In any such ART-based embodiments, note that the replacement channel material and overlayer material can be provided in the context of multilayer stacks that include alternating layers of desired channel material and sacrificial/inactive material, such as that described in U.S. Patent Application Publication 2016/0260802. In still other such cases, the multilayer stacks include two or more layers of channel materials. In any such cases, the various replacement layers may have one or more graded components (semiconductor or doping). As will be appreciated, grading can be used to facilitate a desired lattice matching scheme in the context of lattice-diverse materials, as will be appreciated.

Figure 2C:
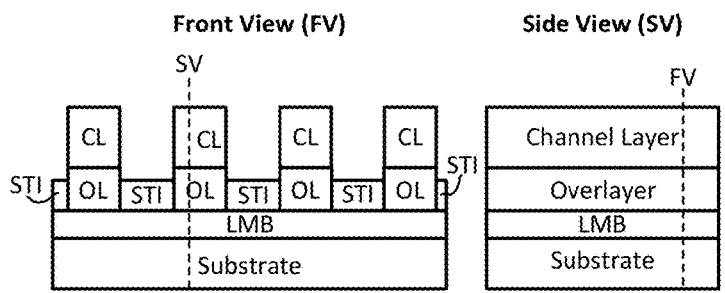

Thus, the resulting fins may be, for example, a single continuous layer of semiconductor material without or without grading, or a material stack, or some combination of these things. Note that the fins in reality may not be perfectly square as shown. Rather, the fins may have a tapered shape, such that each fin gets progressively thinner as the height of the fin increases. The fin widths can vary, depending on the process node, but in some embodiments are in the range of 3 nm to 30 nm wide, as measured at the widest part of the active channel portion of the fin. In any such cases, and with further reference to the example embodiment of FIG. 1, the method continues with filling 109 the trenches between the fins with shallow trench isolation (STI) material (e.g., silicon dioxide or other suitable insulator material), and then polishing and recessing that STI material. The resulting structure is shown in FIG. 2c. The recess depth of the STI material can be set as desired, and effectively defines the active channel portion of the fins. In this example case, the STI is recessed to just below the substrate channel layer (CL)/overlayer (OL) interface. In other embodiments, the STI may be recessed to above that interface, or equal to that interface. In some example cases, for instance, the active channel portion of the fins is about 20 nm to 70 nm tall (from the top surface of the recessed STI to the top of the fin). The overall height of the fins can be, for example 100 nm to 350 nm, and the vertical thickness of the recessed STI material can be, for example, in the range of 50 nm to 300 nm.

Figure 5:
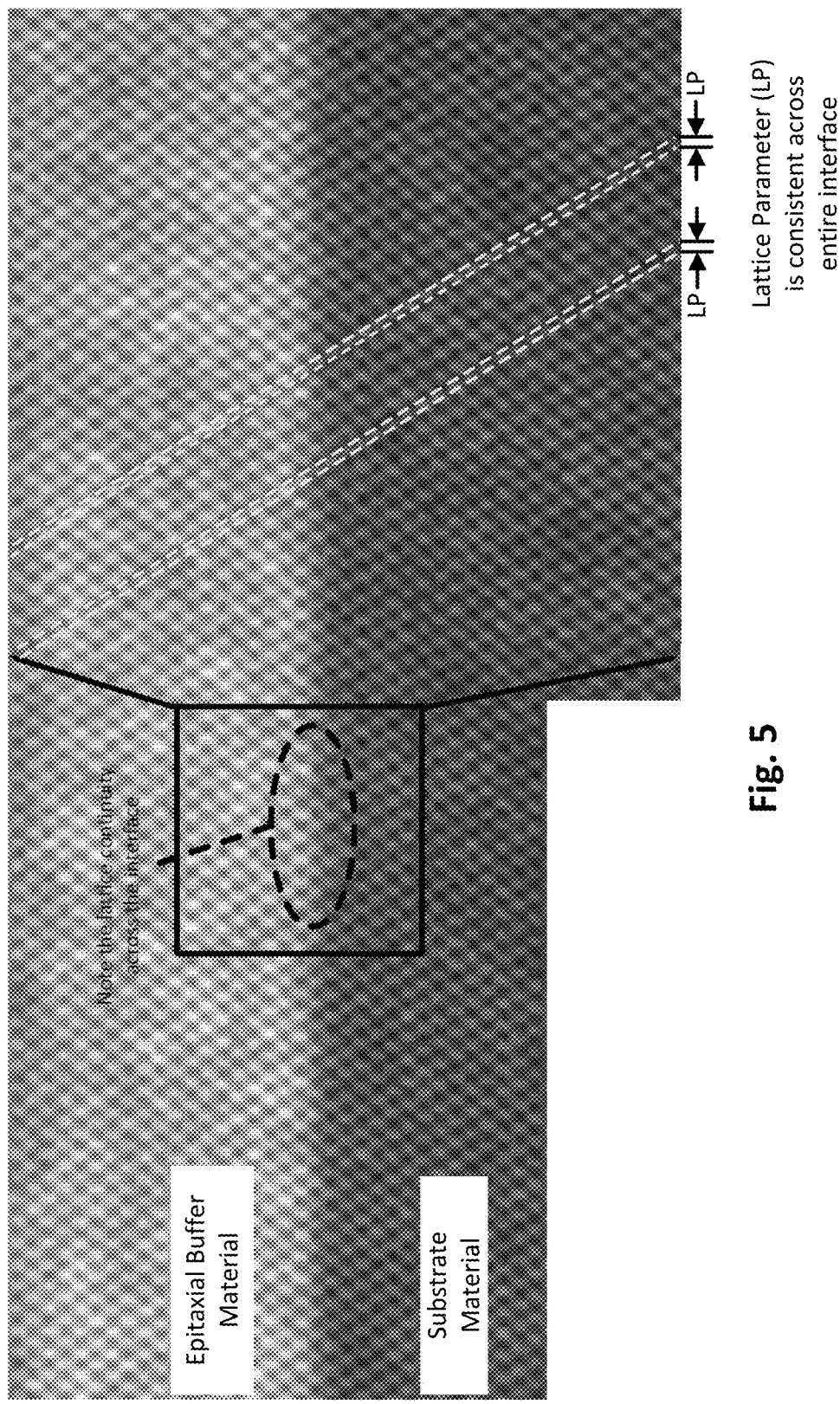
FIG. 5 illustrates an atomic resolution transmission electron microscopy (TEM) showing a lattice matched interface between a single crystal buffer and a single crystal silicon substrate, in accordance with some embodiments of the present disclosure.

In any such configurations, and whether the fins are formed by blanket deposition and etch process or an ART-based process, a lattice matched buffer is provided directly on the silicon substrate. The deposition can be carried out using standard epitaxy. As previously explained, the epitaxial deposition of single crystal buffer material that is lattice matched to the single crystal silicon substrate allows for lattice continuity through the buffer-substrate interface. FIG. 5 illustrates an atomic resolution transmission electron microscopy (TEM) showing a lattice matched interface between a single crystal buffer and a single crystal silicon substrate, in accordance with some embodiments of the present disclosure. As can be seen, the atoms of each material form a diagonal line that continues through each of the two different layers. Two sets of neighboring diagonal lines (annotated with a line overlaid on the image) each define a spacing (LP) between the respective neighboring lines. This spacing is the lattice parameter, and remains substantially constant the entire length of the diagonal, as can be seen in the SEM image. According to some embodiments, the lattice parameter of the buffer material is within +/−2% of the lattice parameter of the single crystal silicon of the substrate. In a more general sense, the buffer material can be lattice matched to the silicon substrate if their respective lattice parameters are otherwise within an acceptable tolerance so as to allow for lattice continuity across the entire buffer-channel interface.

Figure 2D:
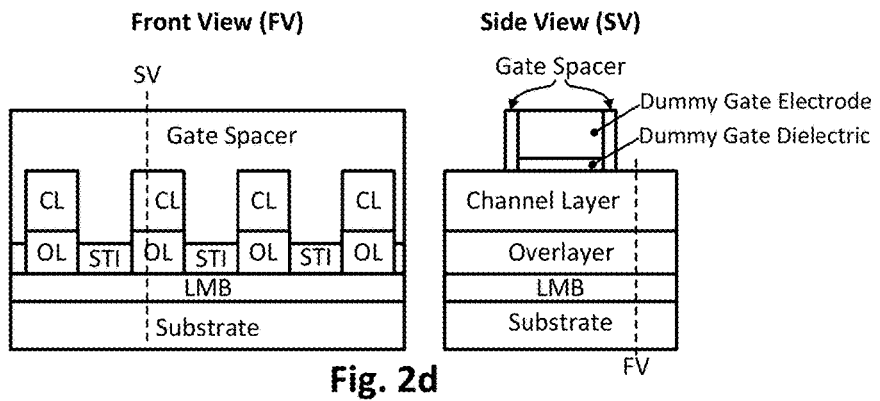

With further reference to the example embodiment of FIG. 1, the method continues with patterning and depositing 111 a gate spacer material, along with a dummy gate oxide and dummy gate electrode, which can be carried out as normally done. The resulting structure is shown in FIG. 2d. Note the dummy gate dielectric and electrode materials are sacrificial in nature, given that this example embodiment is using a gate-last or so-called RMG (remove metal gate) process flow. In such cases, the real gate structure is added later in the process, after the source/drain processing has been carried out (and as will be discussed in turn). In this way, any sensitive gate materials (if any) are not subjected to the processing extremes (e.g., high temperature) associated with the source/drain processing. In other embodiments, the actual gate materials may be added at this point (for gate-first processes), if so desired and as will be appreciated. For purposes of describing this example embodiment, assume an RMG process.

The gate spacer may be formed, for example, using materials such as silicon oxide, silicon nitride, or other suitable gate spacer materials. The width of the gate spacers themselves may generally be chosen based on design requirements for the transistor being formed. The width between the gate spacers effectively defines the width of the gate electrode and gate dielectric, and may be in the range of, for example, 10 nm to 500 nm. The dummy gate dielectric material can be, for example, silicon dioxide, and can be for example 0.5 nm to 10 nm thick (so as to define distance between the channel and gate electrode). The dummy electrode material can be, for example, polysilicon, silicon nitride, silicon carbide, or a metal layer (e.g., tungsten, titanium nitride, tantalum, tantalum nitride) although other suitable dummy materials can be used as well. The thickness (height) of the gate electrode material may be, for example, in the range of about 10 nm to 200 nm. Numerous dummy gate stack configuration can be used.

Figure 2E:
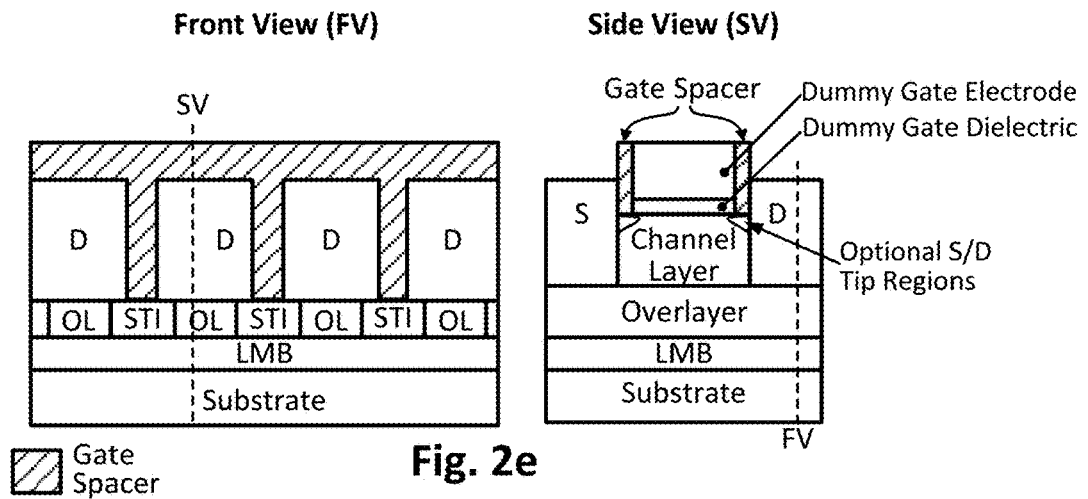

With further reference to the example embodiment of FIG. 1, the method continues with etching 113 the fin to remove the source/drain regions, and then depositing a desired source/drain material. The resulting structure is shown in FIG. 2e. The source/drain regions can be doped in situ, or after the deposition process (e.g., via ion implantation and annealing). This embodiment assumes a replacement source/drain scheme. However, other embodiments may utilize the given fin material(s) to form the source/drain regions, and employ one or more doping techniques (e.g., ion implantation and annealing) to form the source/drain regions, as sometimes done. In still other embodiments, the source/drain regions are processed to form one or more nanowires therein, such as described in U.S. Patent Application Publication 2016/0260802. In any such cases, the source/drain regions can either be p-doped (for PMOS devices) or n-doped (for NMOS devices). The source/drain region material may include any number of group IV and/or III-V materials, and may include single layer or multilayer structures (e.g., bi-layer structure including a liner and capping layer), and may further include one or more components that are graded (e.g., boron-doped SiGe have a graded concentration of both germanium and boron). In some embodiments, the source/drain regions include tip regions that extend under the gate spacer, or both the gate spacer and the gate dielectric (such as shown in the side view of FIG. 2e). In some embodiments, the source/drain regions may be raised relative to the channel region (in the vertical y-direction), such that the top of the source/drain regions (not counting the source/drain contact structure) is higher than the top of the channel layer (such as shown in the side view of FIG. 2e). Likewise, the source/drain regions may be wider (in the lateral x-direction) than the channel regions, in some embodiments (such as shown in the front view of FIG. 2e). Any number of suitable source/drain configurations can be used, as will be appreciated in light of this disclosure, and the present disclosure is not intended to be limited to any particular S/D scheme.

Figure 2F:
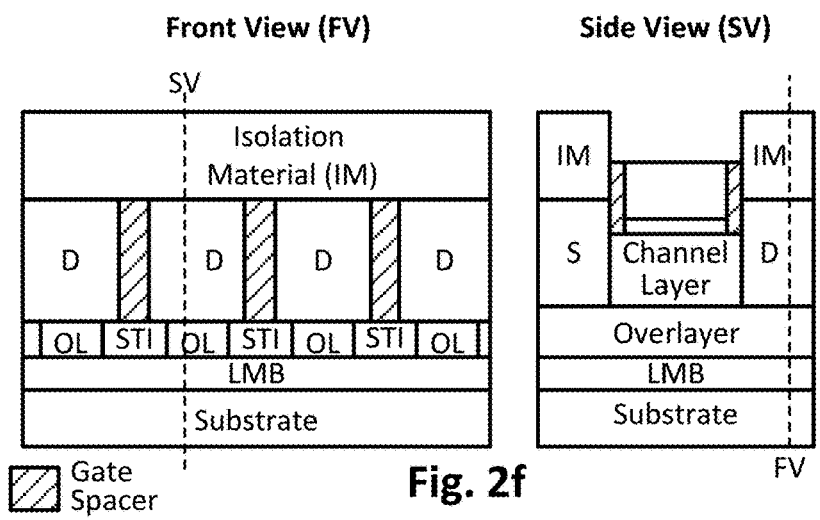
Figure 2G:
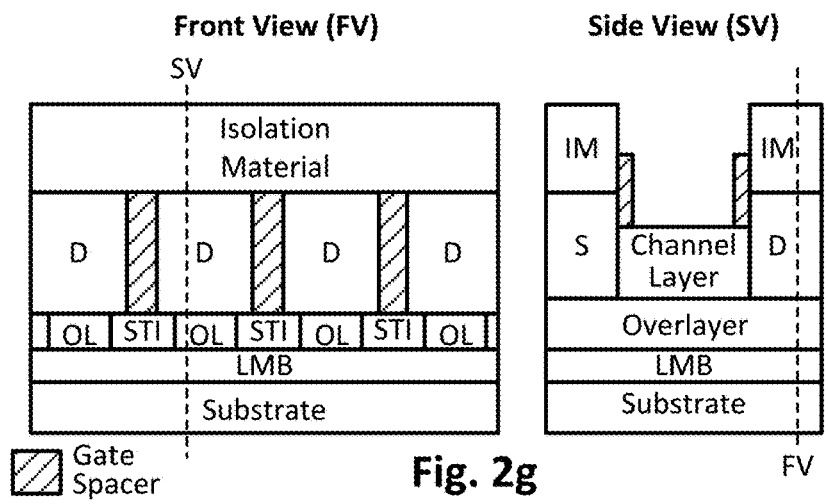

With further reference to the example embodiment of FIG. 1, the method continues with at 115 with depositing fill/isolation material followed by patterning and recessing that material to expose the underlying gate dummy gate structure. Standard deposition, patterning, and etching can be used. The resulting structure is shown in FIG. 2f, which shows the exposed dummy gate structure. The method continues with removing 117 the dummy gate material(s), which in this example case include the dummy gate dielectric and dummy gate electrode materials. Standard etch techniques can be used, and may include patterning and/or selective etch chemistries. The resulting structure after dummy gate removal is shown in FIG. 2g.

Figure 2H:
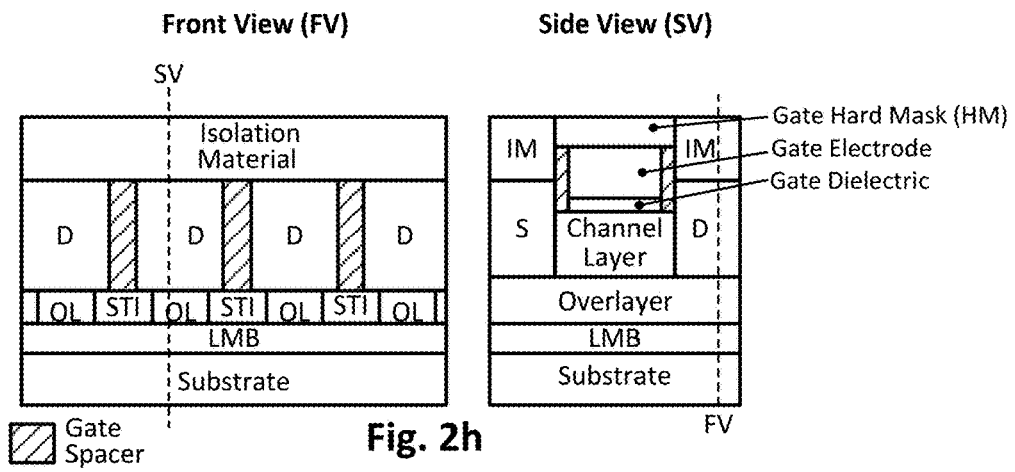

The method continues with depositing 119 gate dielectric material and gate electrode materials. The method may further include depositing a hard mask (HM) over the gate structure. The resulting structure according to some such embodiments is shown in FIG. 2h. The gate dielectric can be, for example, any suitable oxide such as silicon dioxide ($SiO_2$), $SiO_xN_y$, ($0<x<2$ and $0<y<1.5$), or high-k gate dielectric materials. A high-k dielectric generally refers to dielectric materials having a dielectric constant higher than that of $SiO_2$. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. In some specific example embodiments, the high-k gate dielectric layer may have a thickness in the range of 5 Å to around 100 Å thick (e.g., 10 Å). In other embodiments, the gate dielectric layer may have a thickness of one monolayer of dielectric material. In general, the thickness of the gate dielectric should be sufficient to electrically isolate the gate electrode from the source and drain contacts. The gate electrode material can be, for example, polysilicon, silicon nitride, silicon carbide, or a metal layer (e.g., tungsten, titanium nitride, tantalum, tantalum nitride) although other suitable gate electrode materials can be used as well. The thickness (height) of the gate electrode may be, for example, in the range of about 10 nm to 200 nm. The optional hard mask can be used to provide certain benefits or uses during processing, such as protecting the gate electrode from subsequent etch and/or ion implantation processes (e.g., during a gate-first process, as previously noted). The hard mask may be formed using typical hard mask materials, such as silicon dioxide, silicon nitride, and/or other suitable mask materials. In some such example embodiments, the hard mask may include a bi-layer structure to facilitate a desired etch scheme including diverse etch rates.

Figure 2I:
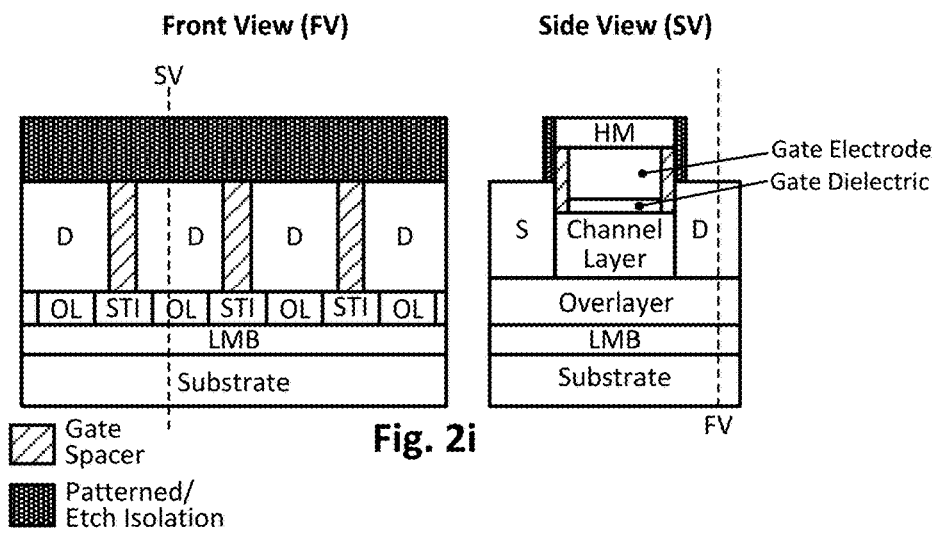
Figure 2J:
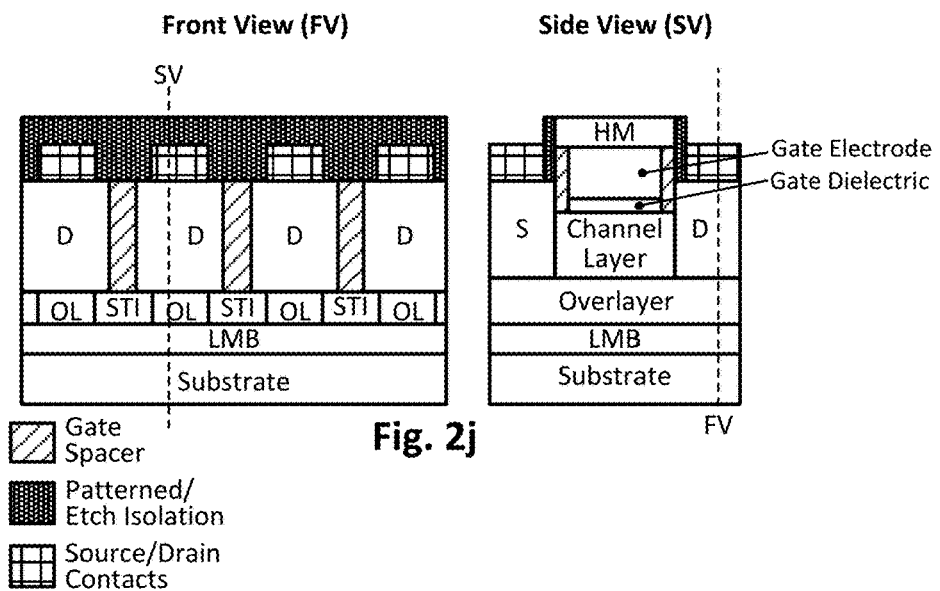

The method continues with patterning and recessing 121 the fill/isolation to expose the underlying source/drain regions. Standard patterning and etching can be used. The resulting structure is shown in FIG. 2i. The method continues with depositing 123 source/drain contacts. Standard contact forming techniques can be used, and may include the provisioning of barrier/liner layers, resistance-reducing layers, and work function tuning layers. The resulting structure is shown in FIG. 2j. The method may continue with further typical processing as needed, including any back-end processing such as interconnect formation. For instance, the structure shown in FIG. 2j can be planarized (e.g., chemical mechanical planarization process) to remove the gate hard mask and excess gate spacer material. Then, an interlayer dielectric (ILD) layer can then be provided, patterned, and etched to provide various recesses that can then be metallized to form the first metal interconnect layer. Multiple such layers can be formed, as needed (e.g., metal layers M0 through M9).

Figure 3A:
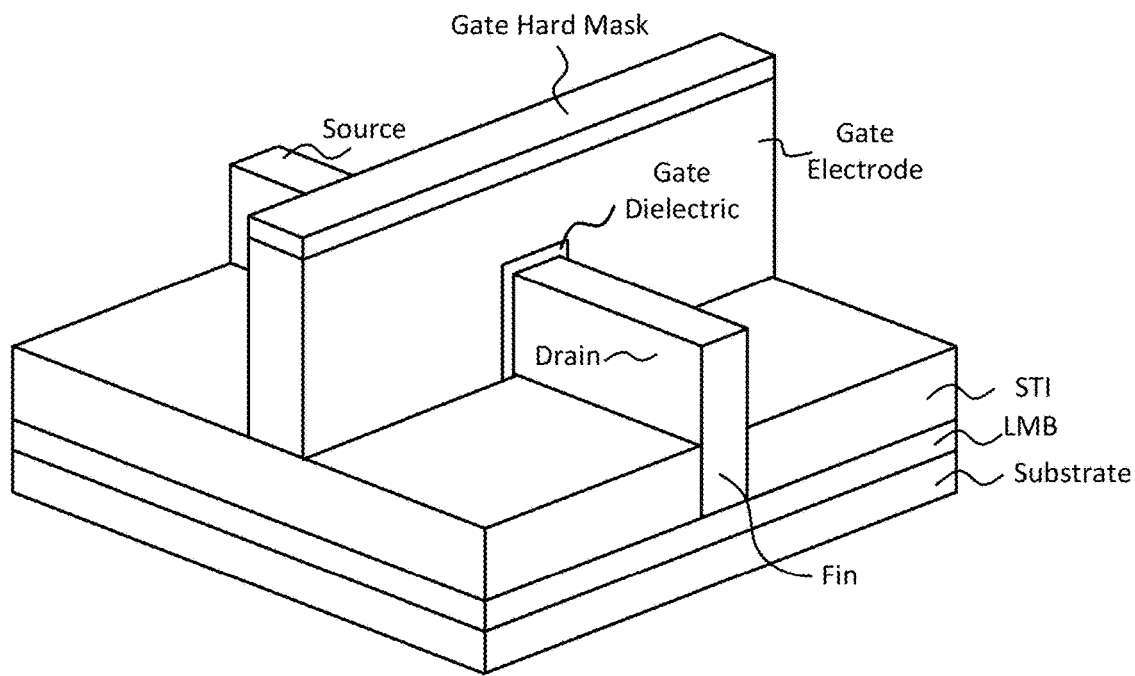
FIGS. 3a and 3b each illustrates a perspective view of an integrated circuit structure formed during the method of FIG. 1, and that is configured in accordance with an embodiment of the present disclosure.
Figure 3B:
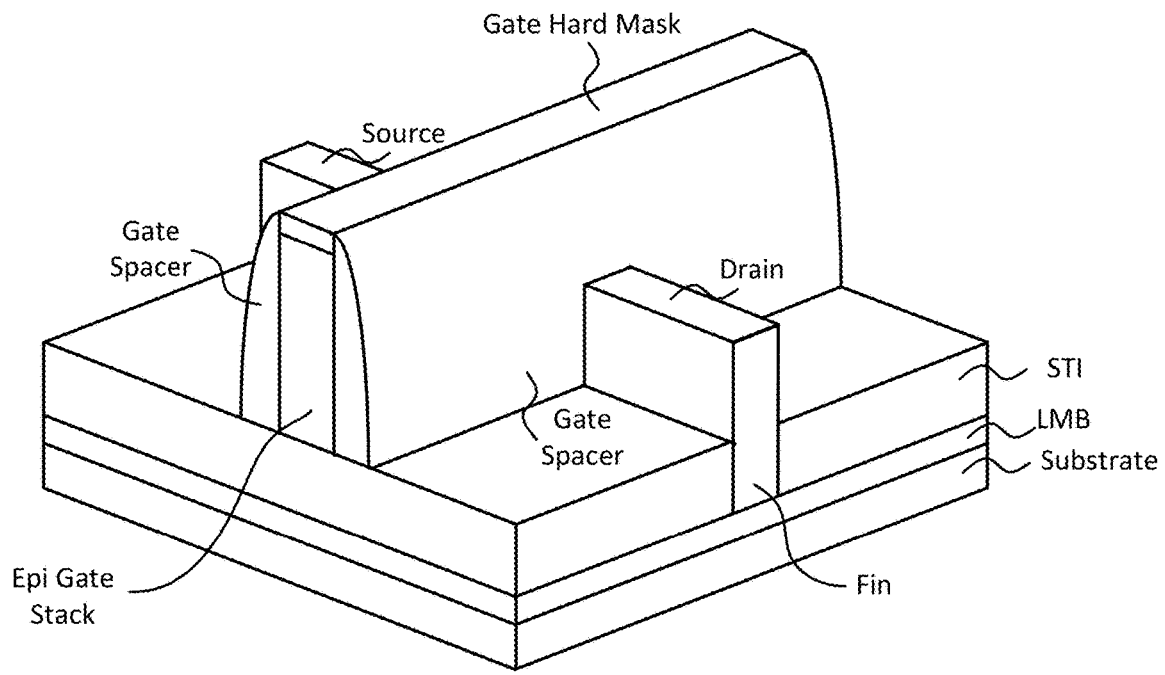

FIGS. 3a and 3b each illustrates a perspective view of an integrated circuit structure formed during the method of FIG. 1, and that is configured in accordance with an embodiment of the present disclosure. Such perspective views can be helpful with respect to non-planar architecture, but as previously explained, other embodiments may utilize planar transistor architecture. The previous discussion with respect to FIGS. 1 and 2a-2j is equally applicable here, as will be appreciated. As can be seen, the example non-planar configuration shown in FIG. 3a includes a substrate having a lattice matched buffer (LMB) thereon and a semiconductor body or fin extending from the buffer through a shallow trench isolation (STI) layer. The portion of the fin above the STI layer effectively forms the channel of the transistor device and can be a single crystal semiconductor as previously explained. Recall, the channel portion of the fin may be any number of suitable semiconductor channel materials. These materials are likely single crystal materials, but need not be lattice matched like the epitaxial buffer.

As can be further seen in FIG. 3a, a gate dielectric material is provided between the fin and a gate electrode, and hard mask is formed on top of the gate electrode. Note that the gate electrode is formed over three surfaces of the fin to form three gates (hence, a tri-gate device). FIG. 3b illustrates the resulting structure after deposition of insulating material and subsequent etch that leaves a coating of the insulator material on the vertical surfaces of the gate stack (which includes the gate dielectric, gate electrode, and gate hard mask, in this example case), so as to provide the gate spacers.

As previously explained, the source/drain regions can be formed in the originally provided fin structure in some embodiments (e.g., the fins provided at 107 of FIG. 1, whether by blanket deposition and etch or an ART-based fin forming process). Alternatively, in other embodiments, the source/drain regions are formed by an etch-and-replace process. Such an etch-and-replace process may be used to provide a single layer or a multilayer source/drain structure. For instance, FIG. 4a illustrates an example transistor structure after growth of an epitaxial source/drain liner and cap configuration in the source/drain regions. The epitaxial liner may be, for example, a thin p-type or n-type silicon-containing (e.g., silicon or SiGe having 70 atomic % silicon) liner, or a pure germanium (e.g., a separate layer of germanium, or a non-detectable layer that is integrated or otherwise included in the composition of the caps). The epitaxial cap can be, for example, p-type or n-type and comprise primarily germanium but may contain less than 20 atomic % tin, according to some embodiments. Numerous other source/drain configurations and material systems can be used, as will be appreciated.

As will further be appreciated, note that an alternative to the tri-gate configuration as shown is a double-gate architecture, which would include a dielectric/isolation layer on top of the fin, such that the gate resides predominately on the two opposing sides of the fin (again, above the STI region). Further note that the example shapes of the epitaxial materials making up the source/drain regions in this example case are not intended to limit the present disclosure to such shapes; rather, other source/drain configurations and shapes will be apparent in light of this disclosure (e.g., round, square or rectangular source/drain regions may be implemented, whether they be single layer or multilayer, raised, flush, or recessed relative to the top of the channel layer).

FIG. 4b shows a perspective view of a nanowire transistor structure formed in accordance with one embodiment of the present disclosure. A nanowire transistor (sometimes referred to as gate-all-around FET) is configured similarly to a fin-based transistor, but instead of a fin, a nanowire is used and the gate material generally surrounds the channel region on all sides. Depending on the particular design, some nanowire transistors have, for instance, four effective gates. This example embodiment includes two nanowires (generally designated as wire, and is intended to include ribbons and nanowires, depending on aspect ratio), although other embodiments can have any number of wires. The nanowires can be implemented, for example, with p-type (e.g., boron-doped) or n-type (e.g., phosphorous-doped) silicon or germanium or SiGe or III-V nanowires. As can be seen, one nanowire is formed or otherwise provided on a pedestal of the substrate and the other nanowire effectively floats in the source/drain material, which in this example embodiment is a bi-layer construction comprising liner and cap. Other embodiments may have a recess in the substrate in which the nanowire is formed (rather than on a pedestal). In addition, just as with the fin configuration shown in FIG. 4a, note that the nanowires can be replaced in the source/drain regions with a single layer or a bi-layer construction of source/drain material as described herein (e.g., relatively thin silicon or germanium or SiGe liner and relatively thick high concentration germanium cap). Alternatively, the bi-layer construction can be provided around the originally formed nanowire as shown (where the liner is provided around the nanowire, and the cap is then provided around the liner). Alternatively, a single layer construction can be provided around the originally formed nanowire.

FIG. 4c also illustrates another example nanowire configuration having multiple nanowires, but in this example case, inactive material (IM) is not removed from between the individual nanowires during the nanowire forming process, which can be carried out using various conventional techniques. Thus, one nanowire is provided on a pedestal (or recess) of substrate and the other nanowire effectively sits on top of the inactive material. Note the nanowires are active through the channel, but the inactive material is not. As can be seen, the bi-layer source/drain construction of liner and cap is provided around all other exposed surfaces of the nanowires. In other embodiments, a single layer source/drain construction is provided around all other exposed surfaces of the nanowires.

In any such configurations shown in FIGS. 3a-3b and 4a-4c, note that a lattice matched buffer is provided between the channel and the silicon substrate. As will be further appreciated, although the embodiments shown in FIGS. 3a-3b and 4a-4c show the epitaxial buffer structure provided in a blanket fashion, in other embodiments the epitaxial buffer structure is provided directly in a trench during a fin replacement or so-called ART-based fin forming process. Such an example configuration is shown and discussed with reference to FIG. 2b'.

Example Lattice Matched Material Systems

As will be appreciated, numerous example embodiments can be formed in accordance with the present disclosure. A few specific example embodiments will now be provided. These examples are not intended to limit the present disclosure; rather, they are provided to simply show example use cases. Numerous will be apparent.

Example A includes: a bulk single crystal silicon substrate or SOI structure on a silicon wafer; a buffer layer of single crystal $SrTiO_3$; and a channel layer of single crystal silicon.

Example B includes: a bulk single crystal silicon substrate or SOI structure on a silicon wafer; a buffer layer of single crystal lanthanum oxide ($La_2O_3$); and a channel layer of single crystal silicon.

Example C includes: a bulk single crystal silicon substrate or SOI structure on a silicon wafer; a buffer layer of single crystal $(LaY)_2O_3$; and a channel layer of single crystal germanium.

Example D includes: a bulk single crystal silicon substrate or SOI structure on a silicon wafer; a buffer layer of single crystal $LaLuO_3$; and a channel layer of single crystal silicon.

Example E includes: a bulk single crystal silicon substrate or SOI structure on a silicon wafer; a buffer layer of single crystal SrTiO3; and a channel layer of single crystal SiGe.

Example F includes: a bulk single crystal silicon substrate or SOI structure on a silicon wafer; a buffer layer of single crystal $LaAlO_3$; and a channel layer of single crystal SiGe.

In any of these examples, note that any number of various materials can be used for other features of the transistor structure. Example such features according to some embodiments include: a gate dielectric of $SiO_2$ or $SiO_xN_y$ (0<x<2 and 0<y<1.5); a gate electrode of polysilicon; a gate spacer of $SiO_2$ or SiN; source/drain regions of boron-doped SiGe, phosphorous-doped silicon, boron-doped germanium, or phosphorous-doped germanium; and an STI/insulator fill of $SiO_2$ or SiN.

Note that dimensions provided herein are simply examples only, and not intended to limit the present disclosure in any way. Further note that standard patterning and selective etch processes (including wet and/or dry etch schemes) can be used to form the various structures provided herein. Likewise, except for the single crystal lattice matched buffer materials, which are deposited via epitaxy to form a continuous crystal structure as variously provided herein, other materials can be deposited using any suitable conventional deposition processes such as chemical vapor deposition (CVD), atomic layer deposition (ALD), spin-on deposition (SOD), or physical vapor deposition (PVD), thermal growth, oxidation based growth, electroless plating, and electroplating, to name a few. Standard processing parameters can be used.

Example Computing System

Figure 6:
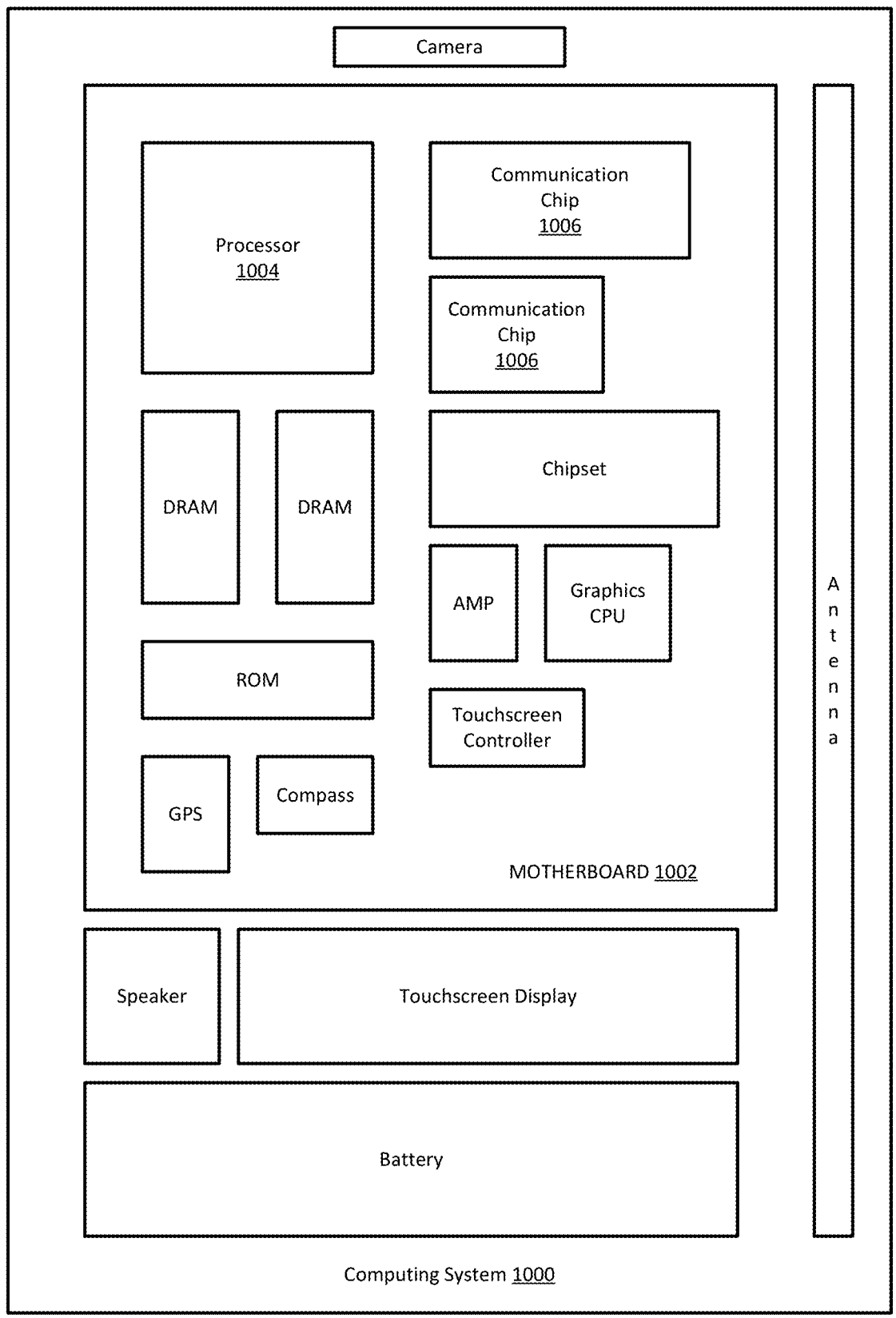
FIG. 6 is an example computing system including one or more of the integrated circuit structures configured in accordance with some embodiments of the present disclosure.

FIG. 6 is an example computing system including one or more of the integrated circuit structures configured in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices configured in accordance with an example embodiment (e.g., MOS transistors configured with a single crystal buffer structure that is lattice matched to the silicon substrate). In some example embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some example embodiments, communication chip 1006 may include one or more MOS transistor devices each having a sub-channel buffer that is lattice matched to a silicon substrate, as variously provided herein.

The processor 1004 of the computing system 1000 includes an integrated circuit die packaged within the processor 1004. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a computer system, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit transistor structure, comprising: a substrate including single crystal silicon; a buffer structure directly on a single crystal silicon surface of the substrate and including a single crystal dielectric material that is lattice matched to the single crystal silicon of the substrate; a channel layer above the buffer structure and including a semiconductor material; and source and drain regions proximate the channel layer, such that the channel layer is between the source and drain regions.

Example 2 includes the subject matter of Example 1, wherein the substrate is a bulk silicon substrate.

Example 3 includes the subject matter of Example 1, wherein the substrate is a multilayer structure including a top layer of single crystal silicon.

Example 4 includes the subject matter of any of the preceding Examples, and further includes a gate stack including a gate dielectric layer over the channel layer and a gate electrode over the gate dielectric layer.

Example 5 includes the subject matter of Example 4, wherein the gate dielectric comprises a high-k gate dielectric.

Example 6 includes the subject matter of any of the preceding Examples, and further includes source and drain contact structures in contact with the source and drain regions, respectively.

Example 7 includes the subject matter of any of the preceding Examples, wherein the channel layer is compositionally different from the substrate.

Example 8 includes the subject matter of any of the preceding Examples, wherein the semiconductor material of the channel layer includes one or more of silicon, germanium, tin, indium, gallium, arsenic, and aluminum.

Example 9 includes the subject matter of any of the preceding Examples, wherein the semiconductor material of the channel layer includes an overlayer portion and a channel portion, and the overlayer portion is disposed between the buffer structure and the channel portion.

Example 10 includes the subject matter of Example 9, wherein the overlayer portion is undoped and the channel portion is doped.

Example 11 includes the subject matter of any of Examples 1 through 8, and further includes an overlayer of semiconductor material disposed between the buffer structure and the channel layer, wherein the semiconductor material of the overlayer is compositionally different than the semiconductor material of the channel layer.

Example 12 includes the subject matter of Example 11, wherein the overlayer is undoped and the channel layer is doped.

Example 13 includes the subject matter of any of the preceding Examples, wherein the transistor structure is a non-planar transistor structure, such that the channel layer includes at least one of a fin and a nanowire.

Example 14 includes the subject matter of any of the preceding Examples, wherein the source and drain regions each includes at least one of a fin and a nanowire.

Example 15 includes the subject matter of any of the preceding Examples, wherein the transistor structure is included in a central processing unit, a memory, or a wireless communication chip.

Example 16 includes the subject matter of any of the preceding Examples, wherein the transistor structure is included in one of a stationary computing system, a mobile computing system, or test equipment.

Example 17 includes the subject matter of any of the preceding Examples, wherein the single crystal dielectric material of the buffer structure includes one or more of strontium, titanium, lanthanum, aluminum, neodymium, lutetium, and gadolinium.

Example 18 includes the subject matter of any of the preceding Examples, wherein the single crystal dielectric material of the buffer structure comprises a single crystal oxide or nitride material.

Example 19 includes the subject matter of any of the preceding Examples, wherein the single crystal silicon of the substrate has a first lattice parameter and the single crystal dielectric material of the buffer structure has a second lattice parameter that is within +/−2% of the first lattice parameter.

Example 20 includes the subject matter of any of the preceding Examples, wherein the single crystal silicon of the substrate has a first lattice parameter and the single crystal dielectric material of the buffer structure has a second lattice parameter that is within a tolerance of the first lattice parameter such that there is lattice continuity across the entire interface between the substrate and the buffer structure.

Example 21 is an integrated circuit transistor structure, comprising: a bulk single crystal silicon substrate; a buffer structure directly on a single crystal silicon surface of the substrate and including a single crystal dielectric material that is lattice matched to the single crystal silicon of the substrate, the single crystal dielectric material of the buffer structure including one or more of strontium, titanium, lanthanum, aluminum, neodymium, lutetium, and gadolinium; a channel layer above the buffer structure and including a semiconductor material; a gate stack including a high-k gate dielectric layer over the channel layer and a gate electrode over the gate dielectric layer; source and drain regions proximate the channel layer, such that the channel layer is between the source and drain regions; and source and drain contact structures in contact with the source and drain regions, respectively. The single crystal silicon of the substrate has a first lattice parameter and the single crystal dielectric material of the buffer structure has a second lattice parameter that is within a tolerance of the first lattice parameter, such that there is lattice continuity across the entire interface between the substrate and the buffer structure.

Example 22 includes the subject matter of Example 21, wherein the channel layer is compositionally different from the substrate.

Example 23 includes the subject matter of Example 21 or 22, wherein the semiconductor material of the channel layer includes one or more of silicon, germanium, tin, indium, gallium, arsenic, and aluminum.

Example 24 includes the subject matter of any of Examples 21 through 23, wherein the semiconductor material of the channel layer includes an overlayer portion and a channel portion, and the overlayer portion is disposed between the buffer structure and the channel portion.

Example 25 includes the subject matter of Example 24, wherein the overlayer portion is undoped and the channel portion is doped.

Example 26 includes the subject matter of any of Examples 21 through 23, and further includes an overlayer of semiconductor material disposed between the buffer structure and the channel layer, wherein the semiconductor material of the overlayer is compositionally different than the semiconductor material of the channel layer.

Example 27 includes the subject matter of Example 26, wherein the overlayer is undoped and the channel layer is doped.

Example 28 includes the subject matter of any of Examples 21 through 27, wherein the transistor structure is a non-planar transistor structure, such that the channel layer includes at least one of a fin and a nanowire.

Example 29 includes the subject matter of any of Examples 21 through 28, wherein the source and drain regions each includes at least one of a fin and a nanowire.

Example 30 includes the subject matter of any of Examples 21 through 29, wherein the transistor structure is included in a central processing unit, a memory, or a wireless communication chip.

Example 31 includes the subject matter of any of Examples 21 through 30, wherein the tolerance is +/−2%.

Example 32 is a method for forming an integrated circuit transistor structure, the method comprising: epitaxially depositing a buffer structure directly on a single crystal silicon surface of a substrate, the buffer structure including a single crystal dielectric material that is lattice matched to the single crystal silicon of the substrate; epitaxially depositing a channel layer above the buffer structure and including a semiconductor material; and providing source and drain regions proximate the channel layer, such that the channel layer is between the source and drain regions.

Example 33 includes the subject matter of Example 32, and further includes providing a gate stack including a gate dielectric layer over the channel layer and a gate electrode over the gate dielectric layer.

Example 34 includes the subject matter of Example 32 or 33, and further includes providing source and drain contact structures in contact with the source and drain regions, respectively.

Example 35 includes the subject matter of any of Examples 32 through 34, wherein the semiconductor material of the channel layer includes an overlayer portion and a channel portion, and the overlayer portion is disposed between the buffer structure and the channel portion.

Example 36 includes the subject matter of Example 35, wherein the overlayer portion is undoped and the channel portion is doped.

Example 37 includes the subject matter of any of Examples 32 through 34, and further includes providing an overlayer of semiconductor material disposed between the buffer structure and the channel layer, wherein the semiconductor material of the overlayer is compositionally different than the semiconductor material of the channel layer.

Example 38 includes the subject matter of Example 37, wherein the overlayer is undoped and the channel layer is doped.

Example 39 includes the subject matter of any of Examples 32 through 38, wherein the transistor structure is a non-planar transistor structure, such that the channel layer includes at least one of a fin and a nanowire.

Example 40 includes the subject matter of any of Examples 32 through 39, wherein the source and drain regions each includes at least one of a fin and a nanowire.

Example 41 includes the subject matter of any of Examples 32 through 40, wherein the transistor structure is included in a central processing unit, a memory, or a wireless communication chip.

Example 42 includes the subject matter of any of Examples 32 through 41, wherein the single crystal dielectric material of the buffer structure includes one or more of strontium, titanium, lanthanum, aluminum, neodymium, lutetium, and gadolinium.

Example 43 includes the subject matter of any of Examples 32 through 42, wherein the single crystal dielectric material of the buffer structure comprises a single crystal oxide or nitride material.

Example 44 includes the subject matter of any of Examples 32 through 43, wherein the single crystal silicon of the substrate has a first lattice parameter and the single crystal dielectric material of the buffer structure has a second lattice parameter that is within +/−2% of the first lattice parameter.

Example 45 includes the subject matter of any of Examples 32 through 44, wherein the single crystal silicon of the substrate has a first lattice parameter and the single crystal dielectric material of the buffer structure has a second lattice parameter that is within a tolerance of the first lattice parameter such that there is lattice continuity across the entire interface between the substrate and the buffer structure.

The foregoing description of example embodiments has been presented for the purposes of illustration and description. It is not intended to be exhaustive or to limit this disclosure to the precise forms disclosed. Many modifications and variations are possible in light of this disclosure. It is intended that the scope of this disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit structure, comprising: a substrate including single crystal silicon; a buffer structure directly on a single crystal silicon surface of the substrate and including a single crystal dielectric material that is lattice matched to the single crystal silicon of the substrate, wherein the single crystal dielectric material of the buffer structure includes one or more of strontium, titanium, lanthanum, neodymium, lutetium, or gadolinium: a semiconductor region above the buffer structure and including a semiconductor material, wherein the semiconductor region includes both a fin and a nanowire; and a source region and a drain region proximate to the semiconductor region, such that the semiconductor region is between the source and drain regions.

2. The integrated circuit structure of claim 1, further comprising a gate stack including a gate dielectric layer over the semiconductor region and a gate electrode over the gate dielectric layer.

3. The integrated circuit structure of claim 1, further comprising:
source and drain contact structures in contact with the source and drain regions, respectively.

4. The integrated circuit structure of claim 1, wherein the semiconductor region is compositionally different from the substrate.

5. The integrated circuit structure of claim 1, wherein the semiconductor material of the semiconductor region includes one or more of silicon, germanium, tin, indium, gallium, arsenic, and aluminum.

6. The integrated circuit structure of claim 1, wherein the semiconductor material of the semiconductor region includes an overlayer portion and a body portion, and the overlayer portion is between the buffer structure and the body portion.

7. The integrated circuit structure of claim 6, wherein the overlayer portion is undoped and the body portion is doped.

8. The integrated circuit structure of claim 1, further comprising an overlayer of semiconductor material between the buffer structure and the semiconductor region, wherein the semiconductor material of the overlayer is compositionally different than the semiconductor material of the semiconductor region.

9. The integrated circuit structure of claim 8, wherein the overlayer is undoped and the semiconductor region is doped.

10. The integrated circuit structure of claim 1, wherein the source and drain regions each includes one or both of a fin and a nanowire.

11. The integrated circuit structure of claim 1, wherein the single crystal dielectric material of the buffer structure is an oxide and further comprises aluminum.

12. The integrated circuit structure of claim 1, wherein the single crystal dielectric material of the buffer structure comprises a single crystal oxide or nitride material.

13. The integrated circuit structure of claim 1, wherein the single crystal silicon of the substrate has a first lattice parameter and the single crystal dielectric material of the buffer structure has a second lattice parameter that is within +/−2% of the first lattice parameter.

14. The integrated circuit structure of claim 1, wherein the single crystal silicon of the substrate has a first lattice parameter and the single crystal dielectric material of the buffer structure has a second lattice parameter that is within a tolerance of the first lattice parameter such that there is lattice continuity across the entire interface between the substrate and the buffer structure.

15. An integrated circuit, comprising: a bulk single crystal silicon substrate; a buffer structure directly on a single crystal silicon surface of the substrate and including a single crystal dielectric material that is lattice matched to the single crystal silicon of the substrate, the single crystal dielectric material of the buffer structure including one or more of strontium, titanium, lanthanum, aluminum, neodymium, lutetium, and gadolinium; a semiconductor layer above the buffer structure and including a semiconductor material, wherein the semiconductor region includes both a fin and a nanowire; and a source region and a drain region proximate to the semiconductor region; a gate stack including a high-k gate dielectric layer over the semiconductor layer and a gate electrode over the gate dielectric layer; a source region and a drain region, wherein the semiconductor layer is between the source and drain regions; and source and drain contact structures in contact with the source and drain regions, respectively; wherein the single crystal silicon of the substrate has a first lattice parameter and the single crystal dielectric material of the buffer structure has a second lattice parameter that is within a tolerance of the first lattice parameter, such that there is lattice continuity between the substrate and the buffer structure.

16. The integrated circuit of claim 15, wherein the semiconductor material of the semiconductor layer includes a first portion and a second portion, and the first portion is between the buffer structure and the second portion, and wherein the first portion is undoped and the second portion is doped.

17. The integrated circuit of claim 15, further comprising an overlayer of semiconductor material between the buffer structure and the semiconductor layer, wherein the semiconductor material of the overlayer is compositionally different than the semiconductor material of the semiconductor layer, and wherein the overlayer is undoped and the semiconductor layer is doped.

18. A substrate comprising: a bulk region including single crystal silicon; a buffer structure directly on a single crystal silicon surface of the bulk region and including a single crystal dielectric material that is lattice matched to the single crystal silicon of the bulk region, the single crystal dielectric material of the buffer structure including one or more of strontium, titanium, lanthanum, aluminum, neodymium, lutetium, and gadolinium; and a semiconductor layer above the buffer structure and including a semiconductor material, wherein the semiconductor region includes both a fin and a nanowire.

19. The substrate of claim 18, wherein the semiconductor layer is compositionally different from the bulk region.

* * * * *